United States Patent [19]

Kida et al.

[11] Patent Number: 5,009,862
[45] Date of Patent: Apr. 23, 1991

[54] APPARATUS AND PROCESS FOR GROWING CRYSTALS OF SEMICONDUCTOR MATERIALS

[75] Inventors: Michio Kida, Urawa; Yoshiaki Arai, Ohmiya; Kensho Sahira, Yono, all of Japan

[73] Assignee: Mitsubishi Kinzoku Kabushiki Kaisha, Tokyo, Japan

[21] Appl. No.: 527,887

[22] Filed: May 23, 1990

Related U.S. Application Data

[62] Division of Ser. No. 201,018, Jun. 1, 1988, Pat. No. 4,936,949.

[30] Foreign Application Priority Data

Jun. 1, 1987 [JP] Japan ................................ 62-137985
Sep. 24, 1987 [JP] Japan ................................ 62-239880

[51] Int. Cl.$^5$ .......................................... C30B 15/12
[52] U.S. Cl. .................................. 422/249; 156/617.1
[58] Field of Search ............ 422/249; 156/612, 617.1, 156/DIG. 68

[56] References Cited

U.S. PATENT DOCUMENTS

| | | | |
|---|---|---|---|
| 2,892,739 | 6/1959 | Rusher | 156/605 |
| 3,637,439 | 1/1972 | DeBie | 422/249 |
| 4,330,361 | 5/1982 | Kuhn-Kuhnenfeld et al. | 156/620.4 |

Primary Examiner—Olik Chaudhuri
Assistant Examiner—Felisa Garrett-Meza
Attorney, Agent, or Firm—Cushman, Darby & Cushman

[57] ABSTRACT

An apparatus for melting a semiconductor material and growing a semiconductor crystal from the melted material includes a susceptor having a peripheral rim, a quartz crucible assembly for receiving the semiconductor material therein. The crucible assembly includes an outer crucible housed in and supported by the susceptor and an inner crucible adapted to be so placed within the outer crucible as to define a multi-wall structure. The apparatus also includes at least one fluid passage for permitting the melted material to flow between the inner and outer crucibles when the multi-wall structure is defined by the inner and outer crucibles, a holder for holding the inner crucible, a heater disposed so as to surround the susceptor for heating the material in the crucible assembly, and a drive mechanism operable to move at least one of the holder and the susceptor vertically between a coupled position where the holder is supported by the susceptor in such a manner that the inner crucible is so placed within the outer crucible as to define the multi-wall structure and a released position where the holder is disengaged from the susceptor in such a manner that the inner crucible is released from the outer crucible.

There is also provided a process which may be conveniently carried out in the apparatus described above.

13 Claims, 5 Drawing Sheets

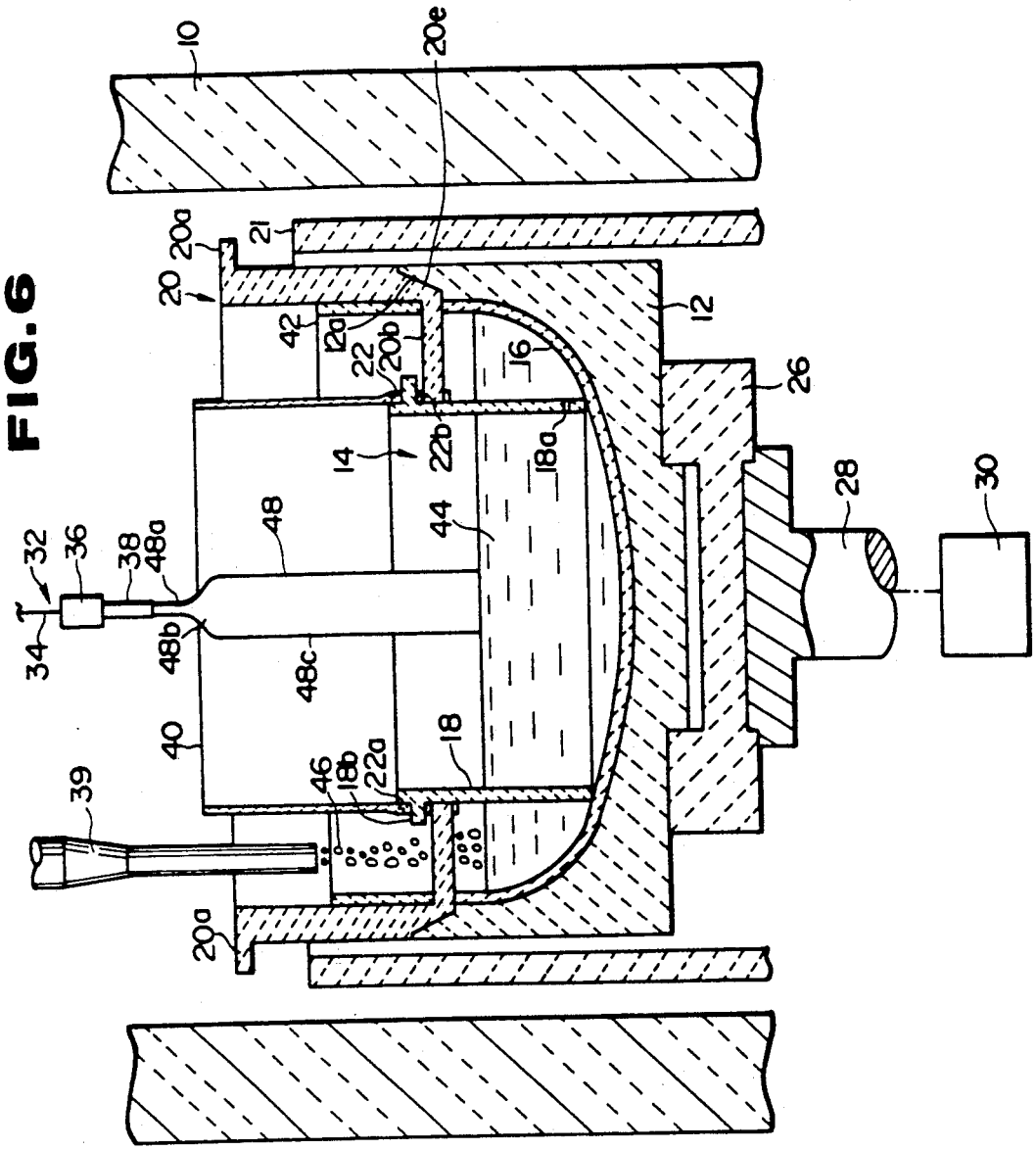

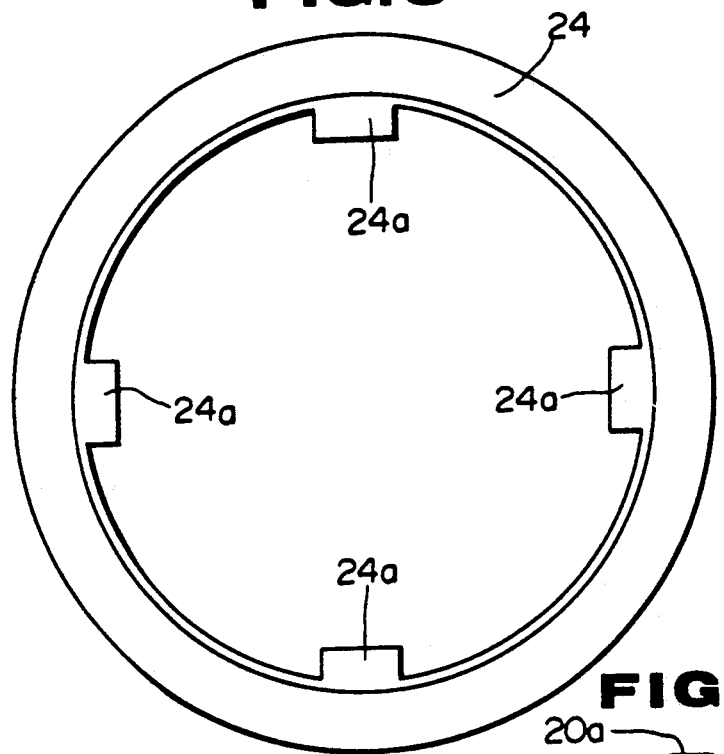
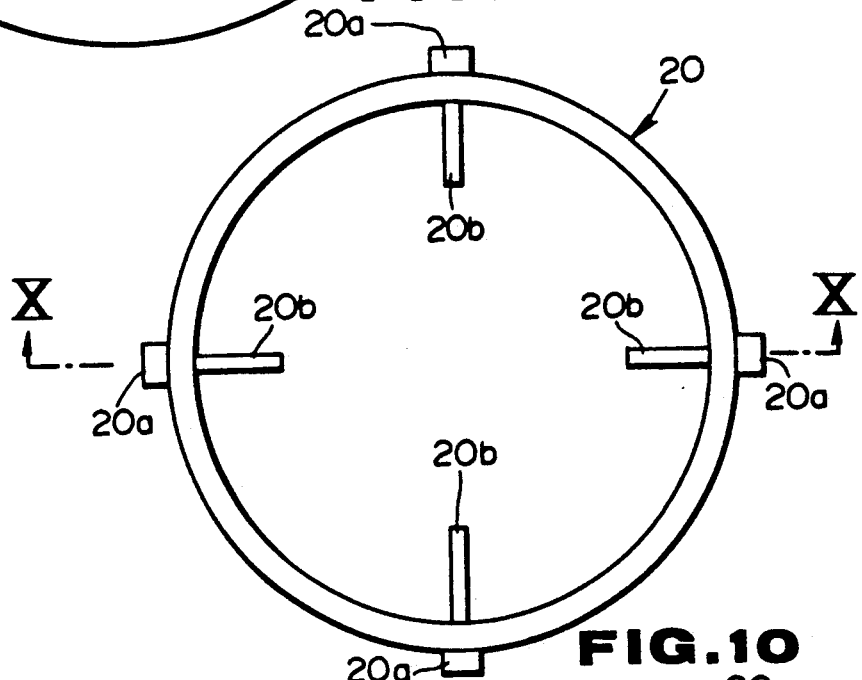
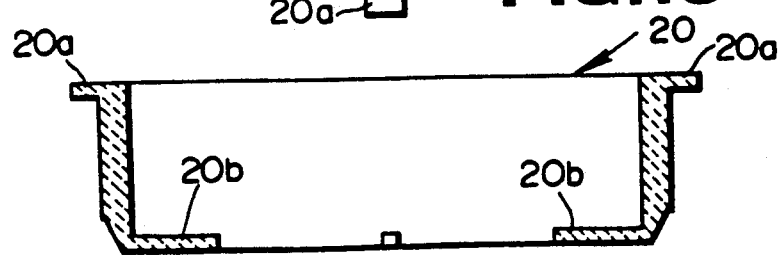

APPARATUS AND PROCESS FOR GROWING CRYSTALS OF SEMICONDUCTOR MATERIALS

This is a division of application Ser. No. 07/201,018, filed June 1, 1988, now U.S. Pat. No. 4,369,949.

BACKGROUND OF THE INVENTION

1. Field of the Invention

The present invention pertains to apparatuses and processes for growing crystals of semiconductor materials for use in making integrated circuit devices and solar cells, for example. More particularly, the invention relates to such apparatuses and processes which operate in accordance with a Czochralski technique making use of a multi-wall type quartz crucible.

2. Prior Art

In a batch type apparatus for the growing of silicon single-crystal ingots, the quantity of a silicon melt contained in a quartz crucible decreases as the crystal grows. As a result, the quality is not uniform longitudinally within the crystalline ingot obtained by the apparatus of this type. More specifically, the oxygen concentration in the crystal depends upon the quantity of oxygen dissolved in the silicon melt, thereby varying as the silicon melt in the quartz crucible varies. In addition, since the quantity of the melt varies, the thermal distribution in the furnace fluctuates and the convection in the melt varies, so that the crystallization front varies. Further, dopant such as phosphorus, boron and antimony is generally added to the melt to control the electric conductivity of the single-crystal. However, insomuch as the segregation constant of such impurities is not identical to 1, the dopant concentration in the crystal differs as the crystal grows.

Thus, the quality of the single-crystal ingot varies in its longitudinal direction, and therefore it has been only a part of the ingot that has a desired quality. Additionally, the productivity has been low in such batch process.

The approach to resolve the above disadvantages is the use of a continuous type apparatus hitherto proposed wherein the single-crystal ingot is grown while the quartz crucible is being charged with a material. U.S. Pat. No. 2,892,739 or Japanese Patent Application A-Publication No. 61-36197 describes one such apparatus which is the simplest in structure and makes use of the combination of a double crucible and the continuous charging of the material in the form of powders, lumps or granules.

The above continuous type apparatus has, however, the following problems. First, although the temperature of the silicon melt is above 1,420° C., the quartz of which the crucible is made begins to get softened at about 1,100° C. As a result, although the outer crucible supported by a graphite susceptor is not deformed from its original shape so greatly, the inner crucible is susceptible to a large deformation since it is not supported sufficiently, so that the growing of the single-crystal is adversely affected.

Specifically, a great quantity of heat has to be applied to the crucible in an initial stage of the pulling cycle in order to melt the material fed in the crucible, and the temperature in the furnace reaches the maximum at that time. Therefore, the deformation of the inner crucible becomes the greatest at that time. FIGS. 1 to 4 of the accompanying drawings schematically illustrate conventional apparatuses each of which comprises a quartz double crucible assembly 100 housed in a susceptor 102 and comprising inner and outer crucibles 100a and 100b, and a resistance heater 104 disposed so as to surround the crucible assembly 100. The double crucible assembly 100 is filled with a charge of silicon material 106, as shown in FIGS. 1 and 3, and the charge is heated by the heater 104 until it is melted thoroughly. Each inner crucible 100a, however, is subjected to deformation as shown in FIGS. 2 and 4 as the silicon material is melted.

Secondly, since quartz has a high heat-insulating effect, the temperature is lower at the inner side of the inner crucible than at the outer side thereof. This may be advantageous during the growth of crystals since the silicon material introduced between the inner and outer crucibles can be melted efficiently, but disadvantageous when melting the silicon material initially fed in the crucible since the inner crucible itself prevents the heat generated by the heater from being transferred to its interior, so that the efficiency of the melting is lowered. If the quantity of heat applied to the material should be increased to reduce the time required for the melting, the inner crucible would be subjected to an excessive deformation.

Furthermore, in Japanese Patent Application A-Publication No. 55-47300, there has been proposed an apparatus as shown in FIG. 5 which comprises the inner crucible 100a fixedly secured to a fixed portion 108 through a support 110. Such apparatus, however, has the disadvantages that the inner crucible 100a cannot be rotated together with the outer crucible 100b. For growing a single-crystal ingot, the crucible has to be generally rotated at a speed of 5 rpm to 10 rpm. Without such rotation, the formation of single-crystals may be difficult.

In conjunction with the use of the double crucible, Japanese Patent Application A-Publication No. 58-204895 discloses an apparatus which comprises a mechanism for causing the inner crucible to rotate and move upwardly and downwardly. The apparatus, however, has the drawbacks that it in itself is large in size and intricate in construction, thereby being high in cost.

SUMMARY OF THE INVENTION

It is therefore a primary object of the present invention to provide an improved apparatus and process for growing semiconductor crystals in which an inner crucible can be prevented in advance from being deformed during the melting of the material.

Another object of the invention is to provide an apparatus and process which can maintain the efficiency of the melting sufficiently high.

A further object of the invention is to provide such an improved apparatus which is simpler in construction, and permitting the inner crucible to rotate during the growing of the crystal so that a single-crystal can be smoothly grown.

According to a first aspect of the present invention, there is provided an apparatus for melting a semiconductor material and growing a semiconductor crystal from the melted material, comprising:

(a) a susceptor having a peripheral rim;

(b) a crucible assembly made of quartz for receiving the semiconductor material therein, the crucible assembly including an outer crucible housed in and supported by the susceptor and an inner crucible adapted to be so placed within the outer crucible as to define a multi-wall structure;

(c) fluid passage means for permitting the melted material to flow between the inner and outer crucibles when the multi-wall structure is defined by the inner and outer crucibles;

(d) holding means for holding the inner crucible;

(e) drive means operable to move at least one of the holding means and the susceptor vertically between a coupled position where the holding means is supported by the susceptor in such a manner that the inner crucible is so placed within the outer crucible as to define the multi-wall structure and a released position where the holding means is disengaged from the susceptor in such a manner that the inner crucible is released from the outer crucible; and (f) heating means disposed so as to surround the, susceptor for heating the semiconductor material contained in the crucible assembly.

According to a second aspect of the present invention, there is provided a method for melting a semiconductor material and growing a semiconductor crystal from the melted material, comprising the steps of:

(a) providing a crystal growing apparatus comprising a susceptor, a crucible assembly of quartz including an outer crucible housed in and supported by the susceptor and an inner crucible adapted to be so placed within the outer crucible as to define a multi-wall structure, and fluid passage means for permitting the melted material to flow between the inner and outer crucibles when the multi-wall structure is defined by the inner and outer crucibles;

(b) moving at least one of the inner and outer crucibles relative to each other to release the inner crucible from the outer crucible;

(c) charging the outer crucible with the semiconductor material;

(d) subsequently heating the outer crucible to thereby melt the semiconductor material in the outer crucible;

(e) subsequently moving the at least one of the inner and outer crucibles relative to each other to couple the inner and outer crucibles together so as to define the multi-wall structure, whereby the melted semiconductor material is introduced into the inner crucible; and (f) subsequently immersing a seed crystal in the melt in the inner crucible and withdrawing the seed crystal from the melt to thereby grow the semiconductor crystal.

BRIEF DESCRIPTION OF THE DRAWINGS

FIG. 6 is a vertical cross-sectional view of a crystal growing apparatus provided in accordance with the present invention;

FIG. 8 is a plan view of a support plate;

FIG. 9 is a plan view of a holder;

FIG. 10 is a cross-sectional view of the holder taken along the line X—X in FIG. 9;

DESCRIPTION OF PREFERRED EMBODIMENTS OF THE INVENTION

Figure 1:
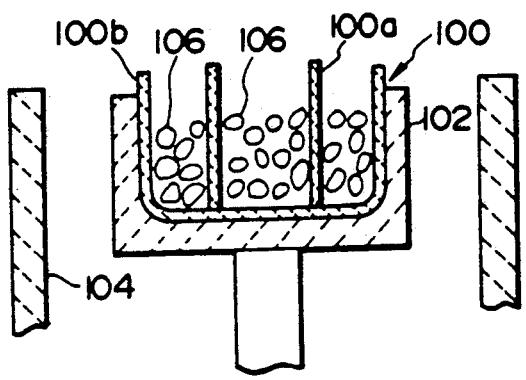
FIG. 1 is a schematic cross-sectional view showing a conventional crystal growing apparatus.
Figure 2:
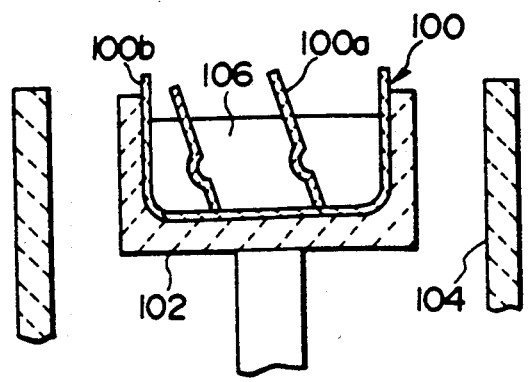
FIG. 2 is a view similar to FIG. 1, but showing how an inner crucible thereof is deformed.
Figure 3:
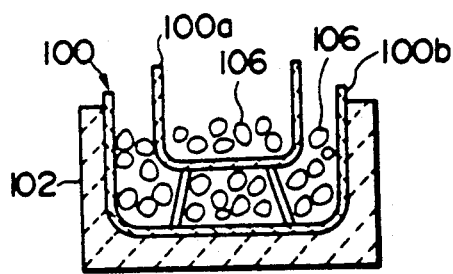
FIG. 3 is a schematic cross-sectional view showing another conventional crystal growing apparatus.
Figure 5:
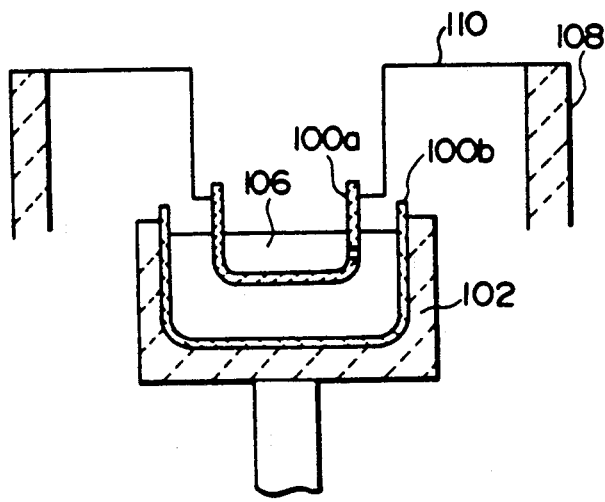
FIG. 5 is a cross-sectional view of a part of a further conventional crystal growing apparatus.
Figure 4:
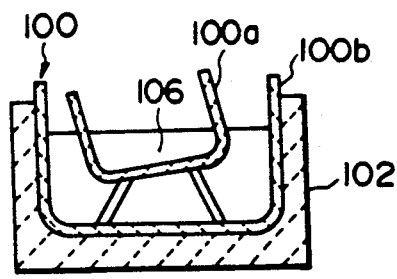
FIG. 4 is a view similar to FIG. 3, but showing how an inner crucible thereof is deformed.

Various embodiments of the present invention will now be described with reference to FIGS. 6 to 15 of the accompanying drawings in which the same reference characters are used to designate like parts or elements in several views.

Referring to FIGS. 6 to 13, there is illustrated an apparatus for growing a silicon single-crystal ingot from a melt. The apparatus comprises a heat reserving shell 10 housed in a furnace (not shown), a susceptor or a support bowl 12 of graphite accommodated within the heat reserving shell 10, a crucible assembly or a double crucible 14 consisting of outer and inner crucibles 16 and 18, a graphite holder 20 for retaining the inner crucible 18, and heating means in the form of a resistance heater 21 disposed within the shell 10 so as to surround the graphite susceptor 12. The susceptor 12 is of a deep dish shape having a sufficient wall thickness and has a peripheral bearing surface 12a formed on its upper rim, the bearing surface 12a tapering radially inwardly and downwardly of the susceptor 12. The outer crucible 16 is also of a deep dish shape, and positioned within and supported by the susceptor 12 with its outer surface held contact with an inner surface of the susceptor 12. The inner crucible 18 is of a cylindrical shape smaller in diameter than the outer crucible 16, and includes a plurality of apertures or fluid passages 18a formed therethrough and disposed adjacent to its lower end. Such apertures 18a permit the flow of molten material toward and away from the inner crucible 18, from and to an annular volume defined between the peripheral walls of the outer and inner crucibles 16 and 18. The inner crucible 18 also includes a plurality of radially-outwardly protruding rib portions 18b integrally formed on its outer peripheral surface in circumferentially equally spaced relation to each other and disposed adjacent to its upper end.

Figure 11:
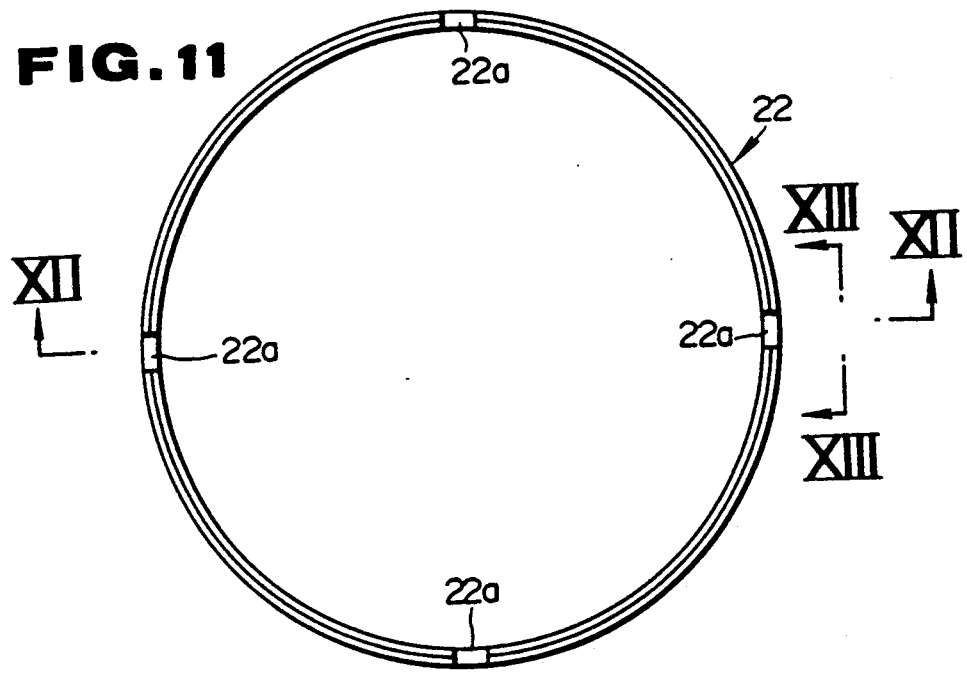
FIG. 11 is a plan view of a joining ring.
Figure 12:
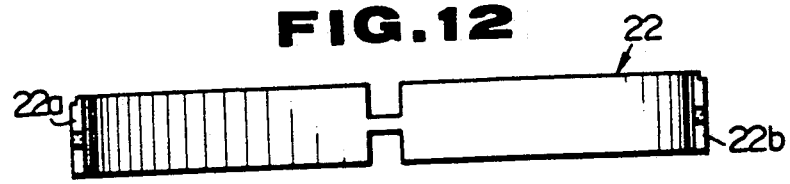
FIG. 12 is a cross-sectional view of the ring taken along the line XII—XII in FIG. 11.
Figure 13:
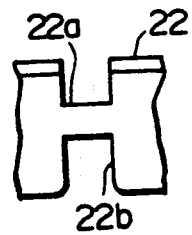
FIG. 13 is an enlarged view of a part of the ring as seen in the direction indicated by the arrows XIII—XIII in FIG. 11.

As best shown in FIGS. 9 and 10, the holder 20 is of a generally cylindrical shape having a uniform diameter, and is provided with a plurality of radially-outwardly protruding tongues or engaging portions 20a integrally formed on its upper end and a plurality of radially-inwardly extending arms 20b integrally formed on its lower end. The holder 20 is disposed around and secured to the inner crucible 18 through a joining ring 22, and adapted to be supported by the heat reserving shell 10 through an annular support plate or member 24. The joining ring 22 has a plurality of upper and lower cut-outs 22a and 22b formed therein as shown in FIGS. 11 and 12, and is disposed around the inner crucible 18 in such a manner that the rib portions 18a of the inner crucible 18 are inserted through the upper cut-outs 22a, respectively. And, with the inner ends of the arms 20d inserted in the lower cut-outs 22b of the joining ring 22, the holder 20 is firmly joined to the inner crucible 18.

The annular support plate 24, as shown in FIG. 8, includes a plurality of radially-inwardly protruding support portions 24a formed on its inner periphery in circumferentially equally spaced relation to each other, and is disposed on and fixedly secured to the upper end of the heat reserving shell 10. The support plate 24 is designed such that an imaginary circle on which the respective inner ends of the support portions 24a lie is smaller in diameter than an imaginary circle on which the respective outer ends of the engaging portions 20c of the holder 20 lie, but that the inner periphery of the support plate is larger in diameter than the holder 20. With this construction, the holder 20 which carries the inner crucible 18 can be supported b the support plate 24 with the engaging portions 20c resting on the support portions 24a, respectively, and also can be disengaged or released from the support plate 24 and moved vertically therethrough.

Further, the holder 20 includes a positioning peripheral surface 20e formed on its lower end and tapering radially inwardly and downwardly thereof, and is adapted to be firmly received by the susceptor 12 with the tapered positioning surface 20e mated with the bearing surface 12a of the susceptor 12. As best shown in FIG. 6, when the holder 20 is received on the susceptor 12, the lower end of the inner crucible 18 is held into contact with the inner surface of the outer crucible 16.

The susceptor 12 is mounted on a pedestal 26 which is situated on a shaft 28 drivingly connected to a main drive mechanism 30 which permits the vertical movement and axial rotation of the shaft 28 during operation. Such main drive mechanism 30 is conventionally provided in a prior art crystal growing apparatus, too, and thanks to this mechanism, the susceptor 12 can be moved vertically between a coupled position where the holder 20 is supported by the susceptor 12 so that the inner crucible 18 is located within the outer crucible 16 and a released position where the holder 20 is disengaged from the susceptor 12 so that the inner crucible 18 is removed from the outer crucible 16.

There is also provided a crystal pulling mechanism 32 of a conventional type which comprises a pulling wire 34, retaining means 36 secured thereto for retaining a seed crystal 38 and a drive mechanism (not shown) for pulling and rotating the wire 34. In the illustrated embodiment, the wire is rotated as usual in a direction opposite to the rotation of the double crucible 14.

Figure 7:
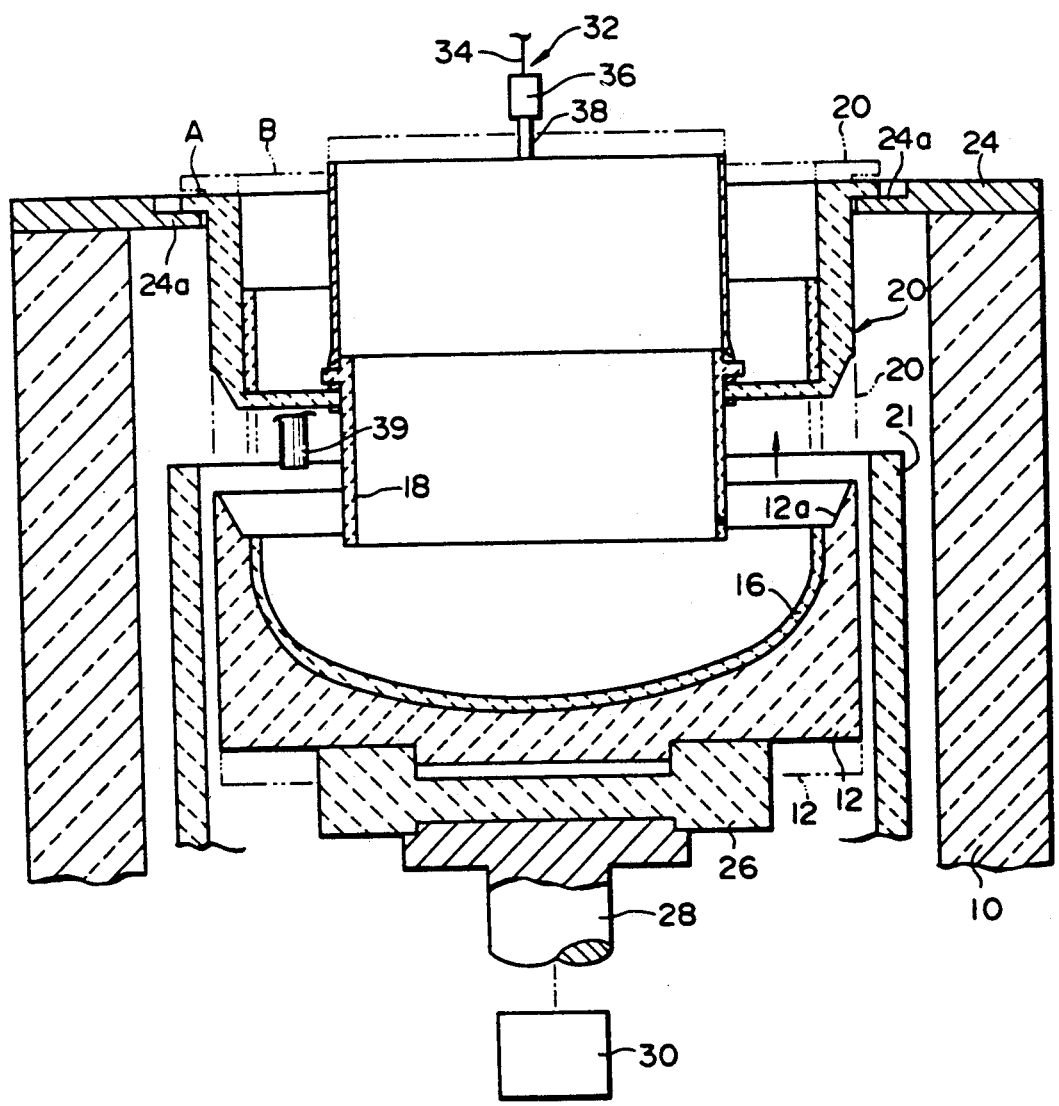
FIG. 7 is a view similar to FIG. 6, but showing a released position where a holder is released from a susceptor.

Further, as shown in FIGS. 6 and 7, a feed pipe 39 is provided for charging the annular space defined between the peripheral walls of the outer and inner crucibles 16 and 18 with a new silicon material, and a cylindrical wall 40, which is made of a material such as graphite, quartz and silicon carbide, is mounted on the joining ring 22 for preventing the silicon material added through the feed pipe 39 from directly dropping into the melt in the inner crucible 18 during the growth of the single-crystal. In addition, the lower portion of the inner peripheral surface of the holder 20 is lined with a cylindrical wall 42 made of quartz for the purpose of preventing the silicon material from contacting the inner surface of the holder 20 which is made of graphite. For the same reason, each arm 20b of the holder 20 may be lined with silicon carbide or the like, or a cap of such a material may be fitted thereon.

The improved process of the present invention may be conveniently carried out in the apparatus described above as follows. In operation, the holder 20 is in advance located on the support plate 24 as designated by A in FIG. 7, so that the inner crucible 18 is shunted above the outer crucible 16. On the other hand, the susceptor 12 is located in a lower portion of the heater 22 in order to ensure the effective melting of the silicon material. In such a condition, the outer crucible 16 is filled with a charge of polycrystal silicon material. Then, the air in the furnace is replaced by argon gas thoroughly, and an electric power is applied to the heater 22 to elevate the temperature in the furnace. As a result, the charge is heated to a prescribed temperature and becomes molten as at 44. After the silicon material is melted completely, the main drive mechanism 30 is activated to cause the shaft 28, hence the susceptor 12, to move upwardly to bring the bearing surface 12a of the susceptor 12 into bearing contact with the positioning surface 20e of the holder 20 until the holder 20 is lifted above the support plate 24 with the engaging portions 20c removed therefrom as designated by B in FIG. 7. Thereafter, the susceptor 12 is turned by the drive means 30 slightly about its axis and is stopped at an angular position where the vertical movement of the holder 20 through the support plate 24 is permitted. The susceptor 12 is then caused to move downwardly, so that the double crucible 14 is located in an appropriate position as shown in FIG. 6.

Subsequently, the temperature of the silicon melt 44 in the double crucible 14 is regulated optimally by the heater 21, and the growing of a single-crystal ingot is commenced in a usual manner. Namely, while rotating the double crucible 14 at a prescribed rate, the seed crystal 38 is lowered and placed in contact with the surface of the melt 44 until the crystal commences to form about the seed, at which time the seed crystal 38 is withdrawn at a prescribed rate while being rotated. As a result, a single-crystal ingot 48 is grown in the order of a neck portion 48a, a shoulder portion 48b and a main rod portion 48c. As the crystal grows, the level of the melt 44 goes down. However, as shown in FIG. 6, a new silicon material 46 in granular form is continuously introduced into the annular space through the feed pipe 39 and hence the material in the double crucible 14 is replenished so that the melt level remains essentially constant.

As described above, in the improved process in accordance with the present invention, the inner crucible 18 is shunted in a prescribed position when the silicon material filled in the outer crucible 16 is heated and melted. Accordingly, although a great quantity of heat is applied to the crucible during the melting of the material, the inner crucible 18, which has been hitherto subjected to an excessive deformation, is hardly heated, thereby being less susceptible to deformation any more.

In addition, in the prior apparatus, the time required for melting the initial charge of the material varies in each operation, and hence the degree of deformation of the inner crucible has been varied in each operation. In the apparatus in accordance with the invention, however, the degree of deformation of the inner crucible is maintained constant, and therefore a silicon single-crystal having a uniform quality can be grown smoothly. Furthermore, insomuch as the inner crucible of which heat conductivity is low is not located within the outer crucible when melting the initial charge of the material, the charge can be effectively melted, so that the time required for the melting can be reduced substantially, thereby enhancing the productivity markedly.

Moreover, a drive mechanism with which the prior art apparatus is equipped is utilized for moving the susceptor as required in the process of the invention, and therefore the apparatus of the invention is simple in construction and is easily overhauled.

Figure 14:
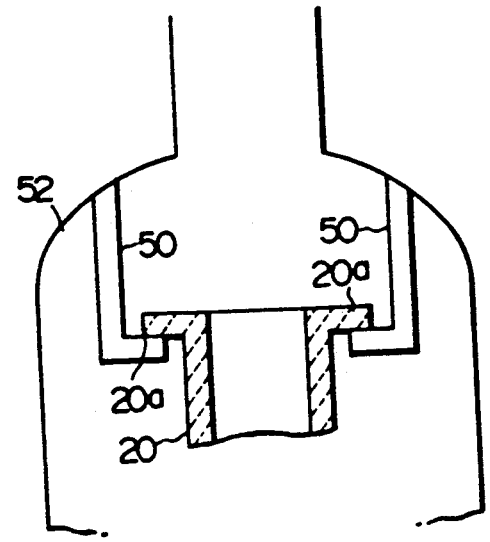
FIG. 14 is a schematic cross-sectional view of a part of a modified apparatus in accordance with the present invention.
Figure 15:
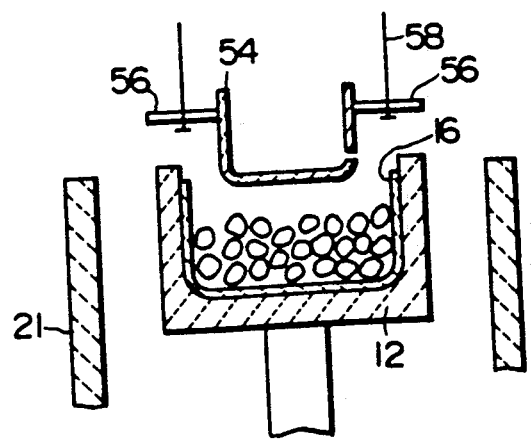
FIG. 15 is a schematic cross-sectional view of another modified apparatus in accordance with the present invention.

While the present invention has been specifically shown and described herein, many modifications and variations are possible in the light of the above teachings. For example, although in the above embodiment, the holder 20 is adapted to be releasably supported by the support plate 24 fixedly secured to the heat reserving shell 10, it may be releasably supported by a plurality of L-shaped elongated support members 50 suspended from a shoulder portion of a furnace 52, as shown in FIG. 14. Such support members may be replaced by a single annular member. In addition, as schematically shown in FIG. 15, a flat-bottomed inner crucible 54 may be utilized instead of the cylindrical inner crucible 18. Further, a modified holder as at 56 may be utilized instead of the above-mentioned holder, and means as at 58 for moving the inner crucible may be provided. In the case where such means 58 is provided, both of the susceptor and the inner crucible may be driven at the same time to be moved between the coupled and released conditions. Moreover, the apparatus and process of the present invention may also be applicable to a batch process. In the batch process, however, the double crucible has to be lifted during crystal growth to maintain an essentially fixed crystallization front. Further, the double crucible may be replaced by a multi-wall crucible with more than two walls. The apertures formed in the inner crucible may be replaced by cut-outs formed in the lower periphery of the inner crucible, or the cylindrical inner crucible may be placed with the lower end slightly spaced from the bottom of the outer crucible to define a peripheral gap serving as fluid passage means for communicating the inside of the inner crucible with the annular space defined between the inner crucible and the peripheral wall of the outer crucible.

What is claimed is:

1. An apparatus for melting a semiconductor material and growing a semiconductor crystal from the melted material, comprising:
   (a) a susceptor having a peripheral rim;
   (b) a crucible assembly made of quartz for receiving the semiconductor material therein, said crucible assembly including an outer crucible housed in and supported by said susceptor and an inner crucible adapted to be so placed within said outer crucible as to define a multi-wall structure;
   (c) fluid passage means for permitting the melted material to flow between said inner and outer crucibles when the multi-wall structure is defined by said inner and outer crucibles;
   (d) holding means for holding said inner crucible;
   (e) drive means operable to move at least one of said holding means and said susceptor vertically between a coupled position where said holding means is supported by said susceptor in such a manner that said inner crucible is so placed within said outer crucible as to define the multi-wall structure and a released position where said holding means is disengaged from said susceptor in such a manner that said inner crucible is released from said outer crucible; and
   (f) heating means disposed so as to surround said susceptor for heating the semiconductor material contained in said crucible assembly.

2. A semiconductor crystal growing apparatus according to claim 1, in which said holding means comprises at least one support member fixedly disposed above said susceptor and a holder supported by said support member and holding said inner crucible.

3. A semiconductor crystal growing apparatus according to claim 2, in which said support member is of an annular shape having a plurality of support portions formed thereon so as to protrude radially inwardly thereof, said holder being of a generally annular shape having a plurality of engaging portions provided on an upper end thereof, said holder being releasably supported by said support member with said engaging portions resting on said support portions, respectively.

4. A semiconductor crystal growing apparatus according to claim 1, in which said peripheral rim of said susceptor has a peripheral bearing surface sloping inwardly downwardly of said susceptor, said holder having a positioning surface formed on a lower end thereof so as slope inwardly downwardly thereof, said positioning surface of said holder being mated with said peripheral bearing surface of said susceptor in said coupled position.

5. A semiconductor crystal growing apparatus according to claim 1, in which said drive means defines rotating means for rotating said susceptor during the growth of the semiconductor crystal.

6. A semiconductor crystal growing apparatus according to claim 1, further comprising rotating means for rotating said susceptor during the growth of the semiconductor crystal.

7. A semiconductor crystal growing apparatus according to claim 2, further comprising a heat reserving shell so disposed as to surround said susceptor, said support member being fixedly secured to said heat reserving shell.

8. A semiconductor crystal growing apparatus according to claim 2, further comprising a furnace in which said susceptor, said crucible assembly, said holding means and said heating means are housed, said support member being fixedly secured to said furnace.

9. A semiconductor crystal growing apparatus according to claim 3, in which said inner crucible includes a plurality of radially-outwardly protruding rib portions formed on an outer peripheral surface thereof, said holding means including a joining ring having a plurality of upper and lower cut-outs formed therein and fitted around said inner crucible in such a manner that said rib portions inserted in said upper cut-outs, respectively, said holder having a plurality of arms provided on the lower end so as to extend radially inwardly thereof, said holder being fixedly secured to said inner crucible with said arms inserted in said lower cut-outs, respectively.

10. A semiconductor crystal growing apparatus according to claim 9, in which said holder includes a cylindrical wall of quartz fitted in and secured to an inner periphery thereof so as to cover at least that portion of the inner periphery disposed adjacent to the lower end.

11. A semiconductor crystal growing apparatus according to claim 10, further comprising feed means for charging said outer crucible with a new semiconductor material and a cylindrical wall mounted on said joining ring for preventing the material from dropping into the melted material in said inner crucible.

12. A semiconductor crystal growing apparatus according to claim 1, in which said inner crucible is defined by an annular peripheral wall.

13. A semiconductor crystal growing apparatus according to claim 1, in which said inner crucible is defined by a bottom and an annular peripheral wall extending therefrom.

* * * * *